US011024783B2

(12) United States Patent
Ohmae et al.

(10) Patent No.: US 11,024,783 B2
(45) Date of Patent: Jun. 1, 2021

(54) LIGHT EMITTING DEVICE AND DISPLAY APPARATUS

(71) Applicant: SONY CORPORATION, Tokyo (JP)

(72) Inventors: Akira Ohmae, Kanagawa (JP); Yusuke Kataoka, Kanagawa (JP); Tatsuo Ohashi, Kanagawa (JP); Sayaka Aoki, Kanagawa (JP); Ippei Nishinaka, Kanagawa (JP); Goshi Biwa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/301,180

(22) PCT Filed: Mar. 29, 2017

(86) PCT No.: PCT/JP2017/012915
§ 371 (c)(1),
(2) Date: Nov. 13, 2018

(87) PCT Pub. No.: WO2017/203826
PCT Pub. Date: Nov. 30, 2017

(65) Prior Publication Data
US 2019/0140154 A1 May 9, 2019

(30) Foreign Application Priority Data
May 27, 2016 (JP) ................................. 2016-105921

(51) Int. Cl.
*H01L 33/00* (2010.01)
*H01L 33/60* (2010.01)
(Continued)

(52) U.S. Cl.
CPC ............... *H01L 33/60* (2013.01); *G09F 9/30* (2013.01); *G09F 9/33* (2013.01); *H01L 25/0753* (2013.01);
(Continued)

(58) Field of Classification Search
CPC ... H01L 25/0753; H01L 27/156; H01L 33/50; H01L 33/60
(Continued)

(56) References Cited

U.S. PATENT DOCUMENTS 6,586,874 B1   7/2003  Komoto et al.
8,439,513 B2 *  5/2013 Yoon ................. G02F 1/133603
                                                     362/249.02
(Continued)

FOREIGN PATENT DOCUMENTS

CN    101151741 A    3/2008
CN    102856349 A    1/2013
(Continued)

OTHER PUBLICATIONS

International Search Report and Written Opinion of PCT Application No. PCT/JP2017/012915, dated Apr. 25, 2017, 06 pages of English Translation and 07 pages of ISRWO.
(Continued)

*Primary Examiner* — Tan N Tran
(74) *Attorney, Agent, or Firm* — Chip Law Group

(57) ABSTRACT

A light emitting device includes a light emitting part 21, a black layer 51, and a light diffusion part 41 that is formed on or above the black layer 51. The black layer 51 is provided with an opening part 53 that allows light emitted from the light emitting part to pass through it. Then, light having passed through the opening part 53 passes through the light diffusion part 41.

13 Claims, 13 Drawing Sheets

(51) Int. Cl.
*H01L 33/58* (2010.01)
*G09F 9/30* (2006.01)
*G09F 9/33* (2006.01)
*H01L 25/075* (2006.01)
*H01L 27/15* (2006.01)
*H01L 33/50* (2010.01)
*H01L 33/44* (2010.01)

(52) U.S. Cl.
CPC ............ *H01L 27/156* (2013.01); *H01L 33/50* (2013.01); *H01L 33/58* (2013.01); *H01L 33/44* (2013.01)

(58) Field of Classification Search
USPC ........................................ 257/88, 98
See application file for complete search history.

(56) References Cited

U.S. PATENT DOCUMENTS

| | | | |
|---|---|---|---|
| 8,944,616 B2* | 2/2015 | Ichinose | H01L 51/5275 362/19 |
| 9,178,123 B2* | 11/2015 | Sakariya | H01L 25/0753 |
| 9,318,726 B2* | 4/2016 | Choi | H01L 51/5275 |
| 2003/0214616 A1 | 11/2003 | Komoto et al. | |
| 2005/0041010 A1 | 2/2005 | Komoto et al. | |
| 2006/0158581 A1 | 7/2006 | Komoto et al. | |
| 2006/0274227 A1 | 12/2006 | Komoto et al. | |
| 2006/0274228 A1 | 12/2006 | Komoto et al. | |
| 2008/0067536 A1 | 3/2008 | Komoto et al. | |
| 2008/0138657 A1 | 6/2008 | Lee et al. | |
| 2008/0225523 A1 | 9/2008 | De Samber et al. | |
| 2011/0051043 A1 | 3/2011 | Kim et al. | |
| 2011/0241538 A1 | 10/2011 | Komoto et al. | |
| 2012/0211766 A1 | 8/2012 | Komoto et al. | |
| 2014/0159064 A1 | 6/2014 | Sakariya et al. | |
| 2014/0191272 A1 | 7/2014 | Jerebic et al. | |
| 2014/0203310 A1 | 7/2014 | Fujii et al. | |
| 2015/0329042 A1* | 11/2015 | Araki | G09F 13/08 362/97.1 |
| 2016/0013167 A1 | 1/2016 | Sakariya et al. | |
| 2016/0064694 A1 | 3/2016 | Choi et al. | |
| 2016/0197310 A1 | 7/2016 | Kubota et al. | |
| 2017/0148773 A1 | 5/2017 | Sakariya et al. | |
| 2018/0374831 A1 | 12/2018 | Sakariya et al. | |

FOREIGN PATENT DOCUMENTS

| | | |
|---|---|---|
| CN | 103890983 A | 6/2014 |
| CN | 104321694 A | 1/2015 |
| CN | 104838508 A | 8/2015 |
| CN | 105453162 A | 3/2016 |
| CN | 107104097 A | 8/2017 |
| DE | 102011079403 A1 | 1/2013 |
| DE | 112013005899 T5 | 9/2015 |
| EP | 1875519 A2 | 1/2008 |
| EP | 2470950 A2 | 7/2012 |
| GB | 2522816 A | 8/2015 |
| JP | 10-319877 A | 12/1998 |
| JP | 2001-144333 A | 5/2001 |
| JP | 2003-017755 A | 1/2003 |
| JP | 3378465 B2 | 2/2003 |
| JP | 2006-119357 A | 5/2006 |
| JP | 2006-145682 A | 6/2006 |
| JP | 2008-535233 A | 8/2008 |
| JP | 2009-212287 A | 9/2009 |
| JP | 2011-243330 A | 12/2011 |
| JP | 5218741 B2 | 6/2013 |
| JP | 2014-137582 A | 7/2014 |
| JP | 2015-034948 A | 2/2015 |
| JP | 2016-503958 A | 2/2016 |
| JP | 5974910 B2 | 8/2016 |
| JP | 6078164 B2 | 2/2017 |
| KR | 10-2007-0117692 A | 12/2007 |
| KR | 10-2014-0053205 A | 5/2014 |
| KR | 10-2015-0084922 A | 7/2015 |
| KR | 10-2017-0045379 A | 4/2017 |
| TW | 200644290 A | 12/2006 |
| TW | 200930141 A | 7/2009 |
| TW | 201314973 A | 4/2013 |
| TW | 201427068 A | 7/2014 |
| TW | 201506867 A | 2/2015 |
| WO | 2006/103596 A2 | 10/2006 |
| WO | 2011/025173 A2 | 3/2011 |
| WO | 2013/010765 A1 | 1/2013 |
| WO | 2014/093063 A1 | 6/2014 |
| WO | 2015/019532 A1 | 2/2015 |

OTHER PUBLICATIONS

International Preliminary Report on Patentability of PCT Application No. PCT/JP2017/012915, dated Dec. 6, 2018, 06 pages of English Translation and 05 pages of IPRP.
Extended European Search Report of EP Application No. 17802428.7, dated May 14, 2019, 11 pages.
Office Action for CN Patent Application No. 201780031187.3, dated Oct. 10, 2020, 07 pages of Office Action and 06 pages of Translation.
Office Action for TW Patent Application No. 2017-111626, dated Aug. 31, 2020.
Extended European Search Report of EP Application No. 201887856.9, dated Dec. 8, 2020, 11 pages.

* cited by examiner

LIGHT EMITTING DEVICE AND DISPLAY APPARATUS

CROSS REFERENCE TO RELATED APPLICATIONS

This application is a U.S. National Phase of International Patent Application No. PCT/JP2017/012915 filed on Mar. 29, 2017, which claims priority benefit of Japanese Patent Application No. JP 2016-105921 filed in the Japan Patent Office on May 27, 2016. Each of the above-referenced applications is hereby incorporated herein by reference in its entirety.

TECHNICAL FIELD

The present disclosure relates to a light emitting device, and to a display apparatus including the light emitting device.

BACKGROUND ART

A light emitting diode display apparatus in which a light emitting device, specifically, a light emitting diode (LED) is arrayed in a two-dimensional matrix form is well-known. Further, preferably, orientation characteristics (radiation distribution) of light emitted from the light emitting device are, for example, a lambertian distribution in order to exclude viewing angle dependence. Therefore, a structure for giving such orientation characteristics is normally provided in an LED package (see, e.g., JP 2011-243330A). Preferably, from a standpoint of an improvement in an image quality, when observing a surface of the light emitting diode display apparatus, a darkly sank state appears. Therefore, the LED package is blackened (see, e.g., JP 2003-017755A).

CITATION LIST

Patent Literature

[PTL 1]
  JP 2011-243330A
[PTL 1]
  JP 2003-017755A

SUMMARY

Technical Problems

However, as the LED is minuter, it is more difficult to provide a structure for giving the above-described orientation characteristics on the LED package. In addition, the following problem arises. That is, a structure for giving the orientation characteristics is provided on a portion other than the LED package and, for example, a color of the LED package is blackened. Thereby, the light emitting diode display apparatus is tried to appear in a darkly sank state. However, as the LED is minuter, a rate of a display region of the display apparatus occupied by the LED package is smaller, and as a result, black floating becomes obvious.

Accordingly, an object of the present disclosure is to provide a light emitting device having a configuration and a structure capable of improving orientation characteristics (radiation distribution) of light emitted from the light emitting device and preventing an occurrence of black floating as well as a display apparatus including the light emitting device.

Solution to Problems

To attain the above object, a light emitting device according to a first aspect of the present disclosure includes:
  a light emitting part;
  a black layer; and
  a light diffusion part that is formed on or above the black layer, in which
  the black layer is provided with an opening part that allows light emitted from the light emitting part to pass through it, and
  light having passed through the opening part passes through the light diffusion part.

To attain the above object, a light emitting device according to a second aspect of the present disclosure includes:
  a light emitting part;
  a black first interlayer film;
  a transparent second interlayer film that is surrounded by the first interlayer film and covers the light emitting part; and
  a light diffusion part that is formed on the second interlayer film, in which
  light emitted from the light emitting part passes through the light diffusion part via the second interlayer film, and
  a light reflection film that reflects a portion of the light emitted from the light emitting part and allows the light to pass through the light diffusion part is formed between the first interlayer film and the second interlayer film.

To attain the above object, a display apparatus (light emitting device display apparatus) of the present disclosure includes arraying the light emitting device according to the first aspect and the second aspect of the present disclosure in a two-dimensional matrix form.

Advantageous Effects of Invention

In the light emitting device according to the first aspect of the present disclosure or the light emitting device according to the first aspect of the present disclosure in the display apparatus of the present disclosure, since light emitted from the light emitting part passes through the light diffusion part, an improvement in orientation characteristics (radiation distribution) of the light emitted from the light emitting device can be achieved, and further, the black layer is included, so that prevention of an occurrence of black floating can be attained. Even in the light emitting device according to the second aspect of the present disclosure or the light emitting device according to the second aspect of the present disclosure in the display apparatus of the present disclosure, since light emitted from the light emitting part passes through the light diffusion part, an improvement in orientation characteristics (radiation distribution) of the light emitted from the light emitting device can be achieved, and further, the black first interlayer film is included, so that the prevention of an occurrence of black floating can be attained. In addition, the effects disclosed in the specification are exemplary ones but not restrictive ones, and there may be additional effects.

DESCRIPTION OF EMBODIMENTS

Figure 1A:
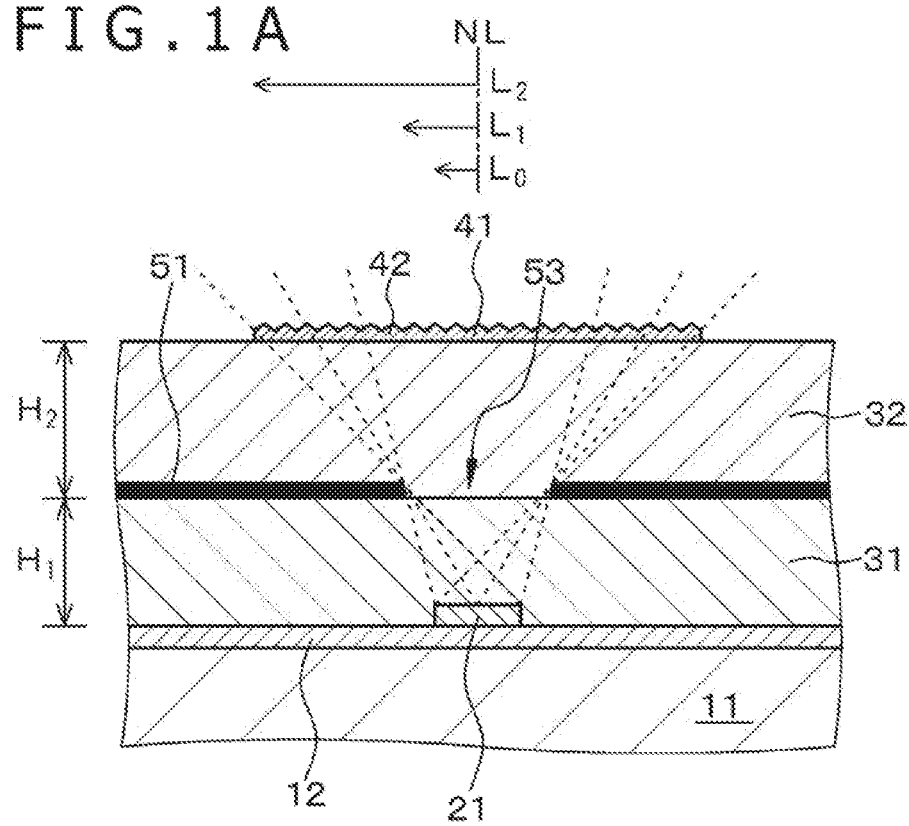
FIGS. 1A and 1B are schematic partial cross-sectional diagrams of a light emitting device of Example 1 and a light emitting device of Example 1A that is a modification example of Example 1.

Hereinafter, the present disclosure will be described on the basis of examples with reference to the drawings. However, the present disclosure is not limited to the examples, and various numerical values and materials in the examples are exemplary ones. In addition, the description will be made in the following order.
1. Light Emitting Device according to First and Second Aspects of the Present Disclosure, Display Apparatus of the Present Disclosure, and Overall Description
2. Example 1 (Light Emitting Device according to First Aspect of the Present Disclosure and Display Apparatus of the Present Disclosure)
3. Example 2 (Light Emitting Device according to Second Aspect of the Present Disclosure)
4. Reference Example 1
5. Reference Example 2
6. Others Light Emitting Device According to First and Second Aspects of the Present Disclosure, Display Apparatus of the Present Disclosure, and Overall Description In a light emitting device according to a first aspect of the present disclosure, a black layer may be embodied to be formed above a light emitting part; and the light emitting device may be embodied to include a first interlayer film that covers the light emitting part and on which the black layer is formed; and a second interlayer film that covers the black layer and on which a light diffusion part is formed. Alternatively, the light emitting device may be embodied to include the first interlayer film on which the black layer is formed; and the second interlayer film that covers the black layer and the light emitting part and on which the light diffusion part is formed, in which the light emitting part may be embodied to be located within the opening part. Alternatively, the light emitting device may be embodied to further include an interlayer film that covers the black layer and the light emitting part and on which the light diffusion part is formed, in which the light emitting part may be embodied to be located within the opening part. In the above modes, the light diffusion part may include a light diffusion region through which light having passed through the opening part passes. Further, in this case, a second black layer may be configured to be formed in a region of the second interlayer film that is not occupied by the light diffusion region. Alternatively, in the above modes, the light diffusion part may include the light diffusion region through which the light having passed through the opening part passes and a light diffusion region extension part that extends from the light diffusion region. Further, in this case, the second black layer may be configured to be formed in a region of the second interlayer film that is occupied by the light diffusion region extension part.

The second interlayer film covers the black layer, and the second interlayer film may be formed even within the opening part that is formed in the black layer or a region of the first interlayer film that is located above the light emitting part may be replaced with the second interlayer film. Further, in the case where the second black layer is formed in a region of the second interlayer film that is not occupied by the light diffusion region, an edge portion of the light diffusion part and an edge portion of the second black layer may overlap with each other. Further, in this case, the edge portion of the light diffusion part may be located on the upper side of the edge portion of the second black layer or may be located on the lower side of the edge portion of the second black layer. In the case where the second black layer is formed in a region of the second interlayer film that is occupied by the light diffusion region extension part, the light diffusion region extension part may be located on the upper side of the second black layer or may be located on the lower side of the second black layer.

In the light emitting device according to the first aspect of the present disclosure including the above-described preferable modes and configurations, a light reflection film that reflects a portion of light emitted from the light emitting part and allows the light to pass through the opening part may be embodied to be formed on the first interlayer film. Specifically, a region of the first interlayer film that is located above the light emitting part is replaced with the second interlayer film. Further, between a portion of the second interlayer film that is located above the light emitting part and a portion of the first interlayer film, the light reflection film is formed. The light reflection film may be formed in the entire region in the thickness direction of the first interlayer film or may be formed in a portion of region therein. Here, in the case of the former, the light emitted from the light emitting part is reflected by the light reflection film and therefore does not penetrate into the first interlayer film. Therefore, a problem that the first interlayer film is deteriorated due to the light emitted from the light emitting part can be prevented from being caused.

Further, in the light emitting device according to the first aspect of the present disclosure including the above-described preferable modes and configurations, the light emitting part may be embodied to be attached to (to be implemented in) a base substance; further an orthogonally projected image of the light emitting part on the base substance and an orthogonally projected image of the black layer on the base substance may be embodied not to overlap with each other. Specifically, for example, the light emitting part may be embodied to be attached to (to be implemented in) a wiring layer that is formed on the base substance including a glass substrate or a printed-wiring board. A gap may be present between the orthogonally projected image of the light emitting part on the base substance and the orthogonally projected image of the black layer on the base substance.

In a light emitting device according to a second aspect of the present disclosure, a black layer may be embodied to be formed on a first interlayer film. Alternatively, the black layer may be embodied to be formed within a first interlayer film. In the light emitting device according to the second aspect of the present disclosure including such a preferable mode, a light emitting part may be embodied to be attached to (to be implemented in) a base substance. Specifically, the light emitting part may be embodied to be attached to (to be implemented in) a wiring layer that is formed on the base substance including a glass substrate or a printed-wiring board.

The light emitting device according to the first aspect and the second aspect of the present disclosure including various preferable modes and configurations described above is applicable to the light emitting device constituting the display apparatus of the present disclosure. Note that in the following description, these light emitting devices may be generically referred to as "the light emitting device, etc. of the present disclosure."

In the light emitting device, etc. of the present disclosure, the light emitting part may include a light emitting diode (LED); however, it is not limited thereto. In addition, the light emitting part may include a semiconductor laser element, etc. In the case where the light emitting part is configured by a light emitting diode or semiconductor laser element, a size of the light-emitting part (e.g., a chip size) is not particularly limited; however, typically, it is minute. Specifically, for example, it is 1 mm or less, or, for example, it is 0.3 mm or less, or, for example, it is 0.1 mm or less, more specifically, it has a size of 0.03 mm or less. In accordance with applications and functions of the display apparatus, specifications required for the display apparatus, and the like, the number, a type, an implementation (arrangement), an interval, and the like of the light emitting devices constituting the display apparatus are determined. The light emitting part may include a red light emitting part that emits a red color, a green light emitting part that emits a green color, a blue light emitting part that emits a blue color, or a combination of the red light emitting part, the green light emitting part, and the blue light emitting part. Specifically, the light emitting part may include a packaged red light emitting part, a packaged green light emitting part, may be configured by a packaged blue light emitting part, or a packaged light emitting unit including the red light emitting part, the green light emitting part, and the blue light emitting part. As materials constituting the package, ceramics, resin, metal, and the like may be exemplified, and further, a structure in which wiring is provided on a substrate constituting the package may be exemplified.

A plurality of light emitting devices (a plurality of pixels) are arrayed in a two-dimensional matrix form in the first direction and in the second direction orthogonal to the first direction. The number of the red light emitting parts constituting the light emitting unit is set to $N_R$, the number of the green light emitting parts constituting the light emitting unit is set to $N_G$, and the number of the blue light emitting parts constituting the light emitting unit is set to $N_B$. In this case, as $N_R$, an integer number of 1 or 2 or more may be exemplified, as $N_G$, an integer number of 1 or 2 or more may be exemplified, and as $N_B$, an integer number of 1 or 2 or more may be exemplified. Values of the $N_R$, $N_G$, and $N_B$ may be equal to each other or may be different from each other. When the values of the $N_R$, $N_G$, and $N_B$ are integer numbers of 2 or more, the light emitting parts may be connected in series to each other or connected in parallel to each other within one light emitting unit. A combination of the values of ($N_R$, $N_G$, $N_B$) is not limited; further, (1, 1, 1), (1, 2, 1), (2, 2, 2), and (2, 4, 2) may be exemplified. When one pixel is configured by three kinds of sub-pixels, a delta array, a stripe array, a diagonal array, and a rectangle array may be exemplified as an array of three kinds of sub-pixels. Further, the light emitting device just has to be driven with a constant current on the basis of a PWM driving method. Alternatively, three panels are prepared, and a first panel can be configured by a plurality of light emitting devices including the red light emitting part, a second panel can be configured by a plurality of light emitting devices including the green light emitting part, and a third panel can be configured by a plurality of light emitting devices including the blue light emitting part. Light from the three panels is applicable to, for example, a projector that is assembled by using a dichroic prism.

As a material constituting light emitting layers of the red light emitting part, the green light emitting part, and the blue light emitting part, for example, a III-V compound semiconductor may be exemplified. Further, as a material constituting the light emitting layer of the red light emitting part, for example, an AlGaInP-based compound semiconductor may be exemplified. As the III-V compound semiconductor, for example, a GaN-based compound semiconductor (including an AlGaN mixed crystal, an AlGaInN mixed crystal, or a GaInN mixed crystal), a GaInNAs-based compound semiconductor (including a GaInAs mixed crystal or a GaNAs mixed crystal), an AlGaInP-based compound semiconductor, an AlAs-based compound semiconductor, an AlGaInAs-based compound semiconductor, an AlGaAs-based compound semiconductor, a GaInAs-based compound semiconductor, a GaInAsP-based compound semiconductor, a GaInP-based compound semiconductor, a GaP-based compound semiconductor, an InP-based compound semiconductor, an InN-based compound semiconductor, and an AlN-based compound semiconductor may be exemplified.

As a material constituting the black layer and the second black layer, acrylic resin, epoxy resin, urethane resin, silicone resin, and cyanoacrylate resin to which, for example, carbon is added may be exemplified. As a method for forming the black layer or second black layer, a method appropriate for these materials, for example, a coating method and a printing method may be exemplified.

As a material constituting a light diffusion part, dielectric materials and glass-based materials such as acrylic resin, epoxy resin, urethane resin, silicone resin, cyanoacrylate resin, and $SiO_2$ may be exemplified. As a method for forming the light diffusion part, a method appropriate for these materials, for example, the coating method and the printing method may be exemplified. An uneven portion is given to a top face of the light diffusion part to thereby diffuse light that is incident on the light diffusion part and is emitted from the light diffusion part. Alternatively, for example, particles are diffused within the light diffusion part to thereby diffuse light that is incident on the light diffusion part and is emitted from the light diffusion part. That is, the light diffusion part can be configured by a member, a surface of which is flat, including a film internally having a diffusion function. As a method for forming the uneven portion in the top face of the light diffusion part, for example, etching processing, laser processing, and sandblasting processing, which may exemplify a formation of the uneven portion at the time of coating or printing, and a vacuum evaporation method may be exemplified.

As a material constituting the first interlayer film and a second interlayer film, and further, as a material constituting a transparent second interlayer film, acrylic resin, epoxy resin, urethane resin, silicone resin, and cyanoacrylate resin may be exemplified. As a material constituting a black first interlayer film, the above materials to which, for example, carbon is added may be exemplified. As a method for forming the above interlayer film, a method appropriate for the above materials, for example, the coating method and the printing method may be exemplified. Note that the transparent second interlayer film means that the second interlayer film is transparent to the light emitted from the light emitting part. Preferably, both the first interlayer film and the second interlayer film are transparent to the light emitted from the light emitting part.

As a material constituting a light reflection film, a simple substance of metal such as aluminum (Al) or silver (Ag), an alloyed metal, and a dielectric multilayer film may be exemplified. As a method for forming the light reflection film, various PVD methods such as the vacuum evaporation method and a sputtering technique, various CVD methods, and a plating method may be exemplified. A shape (a cross-sectional shape of the inclined plane of the first interlayer film at the time of cutting the light emitting device on a vertical virtual plane including a normal line NL passing through the center of the light emitting part) of an inclined plane of the first interlayer film on which the light reflection film is formed may be composed of a line segment or a curved line.

Example 1

Example 1 relates to the light emitting device according to the first aspect of the present disclosure and the display apparatus (light emitting device display apparatus) of the present disclosure. In FIG. 1A, a schematic partial cross-sectional diagram of the light emitting device according to Example 1 is illustrated.

The light emitting device of Example 1 includes a light emitting part 21, a black layer 51, and a light diffusion part 41 formed on or above the black layer 51 (in Example 1, specifically, above the black layer 51). In addition, the black layer 51 is provided with an opening part 53 that allows light emitted from the light emitting part to pass through it. Then, light having passed through the opening part 53 passes through the light diffusion part 41.

Here, the light emitting part 21 is attached to (is implemented in) a base substance 11, and an orthogonally projected image of the light emitting part 21 on the base substance 11 and an orthogonally projected image of the black layer 51 on the base substance 11 do not overlap with each other. The light emitting part 21 is, for example, attached to (is implemented in) a wiring layer 12 that is formed on the base substance 11 including a glass substrate or a printed-wiring board. Note that a gap is present between the orthogonally projected image of the light emitting part 21 on the base substance 11 and the orthogonally projected image of the black layer 51 on the base substance 11.

Further, in the light emitting device of Example 1, the black layer 51 is formed above the light emitting part 21, and a first interlayer film 31 that covers the light emitting part 21 and on which the black layer 51 is formed and a second interlayer film 32 that covers the black layer 51 and on which the light diffusion part 41 is formed are included. Further, the light diffusion part 41 includes a light diffusion region 42 through which light having passed through the opening part 53 passes. The second interlayer film 32 that covers the black layer 51 is formed even within the opening part 53 that is formed in the black layer 51.

In Example 1 or the later-described Example 2 and in Reference Example 1 and Reference Example 2, the light emitting part 21 includes a light emitting diode (LED). Specifically, the light emitting part 21 includes the packaged light emitting unit including the red light emitting part that emits a red color, the green light emitting part that emits a green color, and the blue light emitting part that emits a blue color. The red light emitting part, the green light emitting part, and the blue light emitting part each have a well-known configuration and structure and even the packaged light emitting unit has a well-known configuration and structure.

The black layer 51 or the later-described second black layer 52 includes materials in which carbon is added to epoxy resin. Further, the light diffusion parts 41 and 141 include epoxy resin, silicone resin, or hybrid resin. The first interlayer film 31 and the second interlayer film 32 include epoxy resin, silicone resin, or hybrid resin. In addition, the later-described light reflection film 61 includes metal materials such as Ti, CU, or Al.

The display apparatus (light emitting device display apparatus) of Example 1 or the later-described Example 2 includes arraying the light emitting device of Example 1 or the later-described Example 2 in plurality in a two-dimensional matrix form. As describe above, one pixel constituting the display apparatus includes one red light emitting part, one green light emitting part, and one blue light emitting part. Specifically, $N_R=N_G=N_B=1$ holds.

After the light emitting unit is implemented in the wiring layer 12, the first interlayer film 31 and the black layer 51 having the opening part 53 are formed on the basis of the printing method and further the second interlayer film 32 and the light diffusion part 41 are formed on the basis of the printing method to thereby manufacture the light emitting device of Example 1. Note that the light diffusion part 41 just has to be formed under conditions that an uneven portion is formed on the top face of the light diffusion part 41 at the time of forming the light diffusion part 41 on the basis of the printing method. Alternatively, as a method for forming the uneven portion, for example, etching processing, laser processing, and sandblasting processing may be exemplified and further the vacuum evaporation method may be exemplified. Further, after the black layer 51 is formed on the first interlayer film 31, the opening part 53 can be formed, for example, on the basis of a lithography technique and an etching technique. Alternatively, after a photosetting resin layer is formed on the first interlayer film 31, the photosetting resin layer is set with the exception of a portion in which the opening part 53 ought to be formed to thereby form the opening part 53.

As described above, in the light emitting device of Example 1, light emitted from the light emitting part passes through the light diffusion part. Therefore, even if orientation characteristics (radiation distribution) of light emitted from the light emitting part are in an undesired state, the orientation characteristics (radiation distribution) of light passing through the light diffusion part can be set to a desired state. That is, an improvement in the orientation characteristics (radiation distribution) of light emitted from the light emitting device can be achieved. Further, since the light emitting device includes the black layer, the prevention of an occurrence of black floating can be attained. Further, a miniaturization of the light emitting device and even a miniaturization of an arrangement pitch of the light emitting device can be easily handled.

At the time of cutting off the light emitting device on the vertical virtual plane including the normal line NL that passes through the center of the light emitting part 21, when a distance from the normal line NL to an edge of the light emitting part 21 is set to $L_0$, a distance from the normal line NL to an edge of the opening part 53 is set to $L_1$, a distance from the normal line NL to an edge of the light diffusion part 41 is set to $L_2$, a thickness of the first interlayer film 31 is set to $H_1$, and a thickness of the second interlayer film 32 is set to $H_2$, but not limited thereto, it is preferred that $(L_0+L_1)/H_1 \leq (L_0+L_2)/(H_1+H_2)$ is satisfied. As specific values of $L_0$, $L_1$, $L_2$, $H_1$, and $H_2$, the following values may be exemplified; however, they are not limited thereto.

$L_0$: 15 μm
$L_1$: 50 μm
$L_2$: 150 μm
$H_1$: 50 μm
$H_2$: 100 μm

Example 1A

Figure 1B:
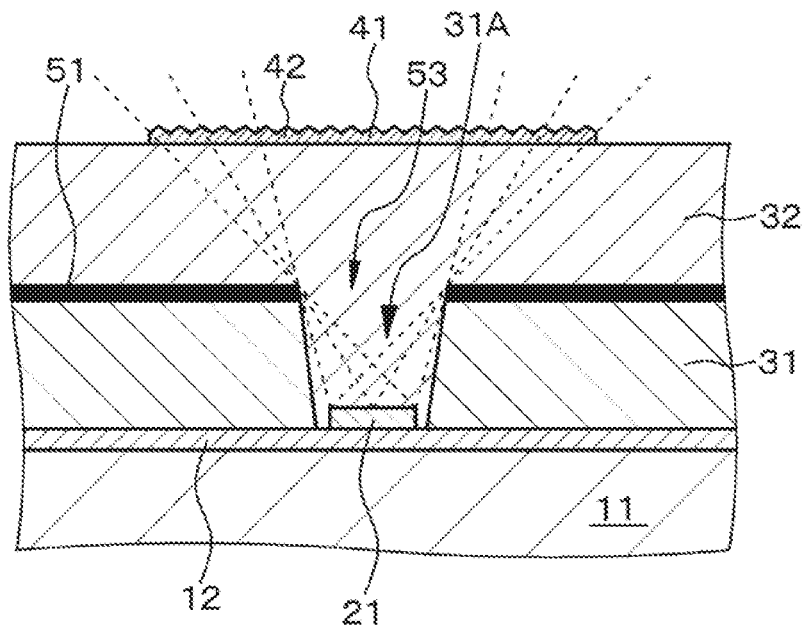

A schematic partial cross-sectional diagram of a light emitting device of Example 1A that is a modification example of the light emitting device of Example 1 is illustrated in FIG. 1B. In the light emitting device of Example 1A, a region 31A of the first interlayer film 31 that is located above the light emitting part 21 is replaced with the second interlayer film 32. Specifically, according to the light emitting device of Example 1A, a portion 31A of the first interlayer film 31 that is located under the bottom of the opening part 53 is removed and the portion 31A is embedded with the second interlayer film 32.

Example 1B

Figure 2A:
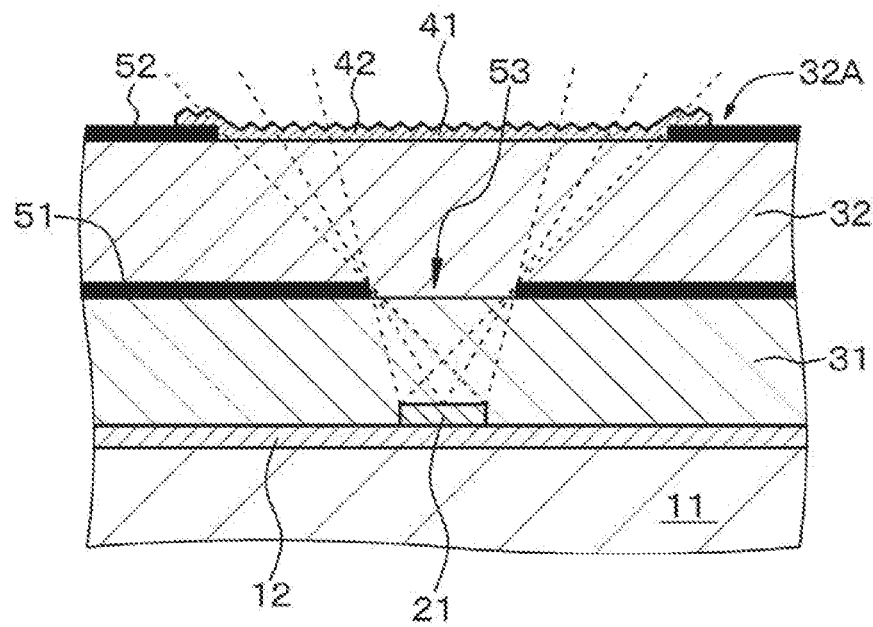
FIGS. 2A and 2B are schematic partial cross-sectional diagrams of a light emitting device of Example 1B that is a modification example of the light emitting device of Example 1.
Figure 2B:
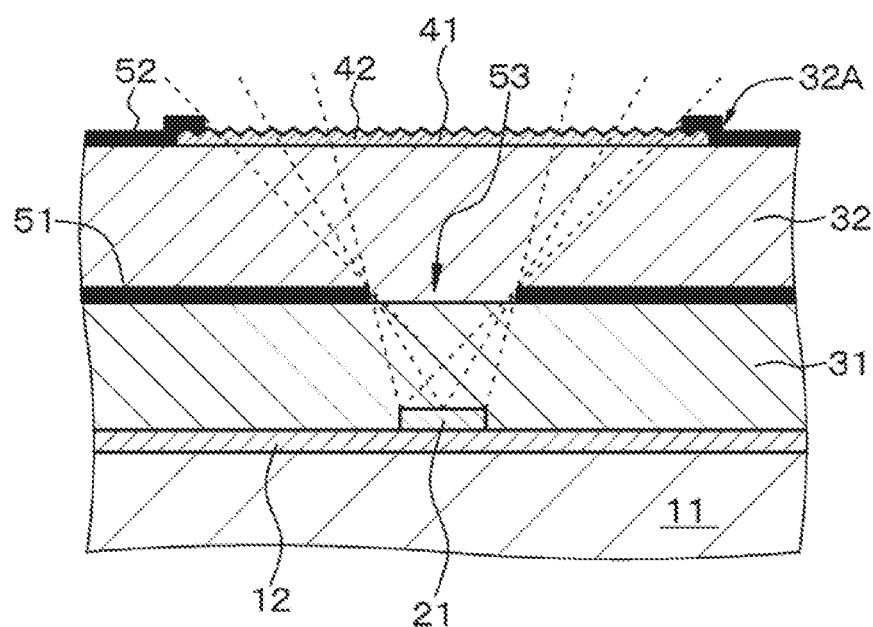

Schematic partial cross-sectional diagrams of a light emitting device of Example 1B that is a modification example of the light emitting device of Example 1 are illustrated in FIGS. 2A and 2B. In the light emitting device of Example 1B, the second black layer 52 is formed in a region 32A of the second interlayer film 32 that is not occupied by the light diffusion region 42. In the illustrated example, an edge portion of the light diffusion part 41 and an edge portion of the second black layer 52 overlap with each other. Further, the edge portion of the light diffusion part 41 is located on the upper side of the edge portion of the second black layer 52 (see FIG. 2A). Alternatively, the edge portion of the light diffusion part 41 is located on the lower side of the edge portion of the second black layer 52 (see FIG. 2B).

Example 1C

Figure 3:
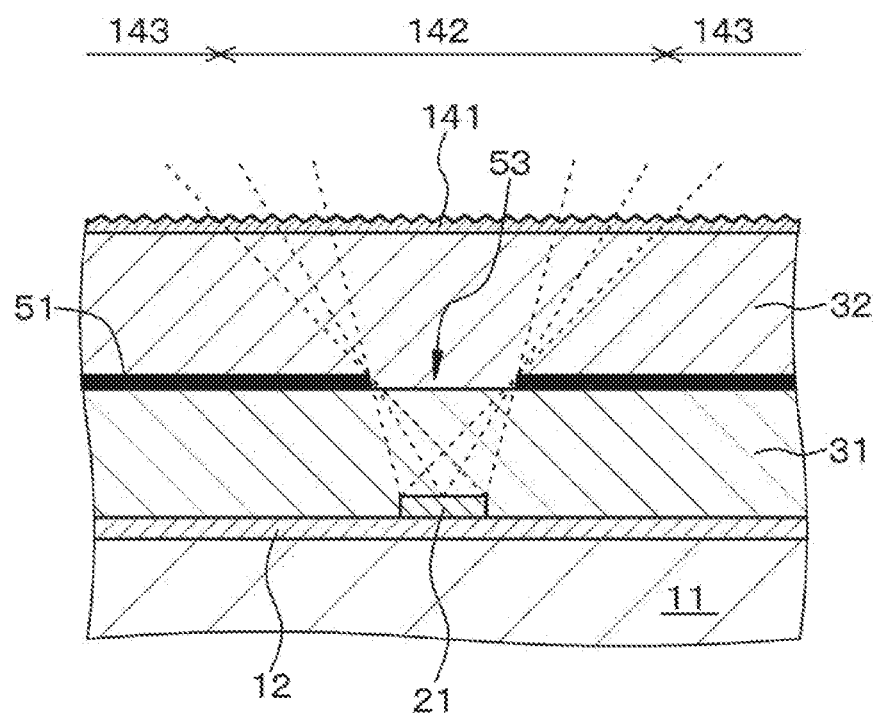
FIG. 3 is a schematic partial cross-sectional diagram of a light emitting device of Example 1C that is a modification example of the light emitting device of Example 1.

A schematic partial cross-sectional diagram of a light emitting device of Example 1C that is a modification example of the light emitting device of Example 1 is illustrated in FIG. 3. In the light emitting device of Example 1C, the light diffusion part 141 includes a light diffusion region 142 through which light having passed through the opening part 53 passes and a light diffusion region extension part 143 that extends from the light diffusion region 142.

Example 1D

Figure 4A:
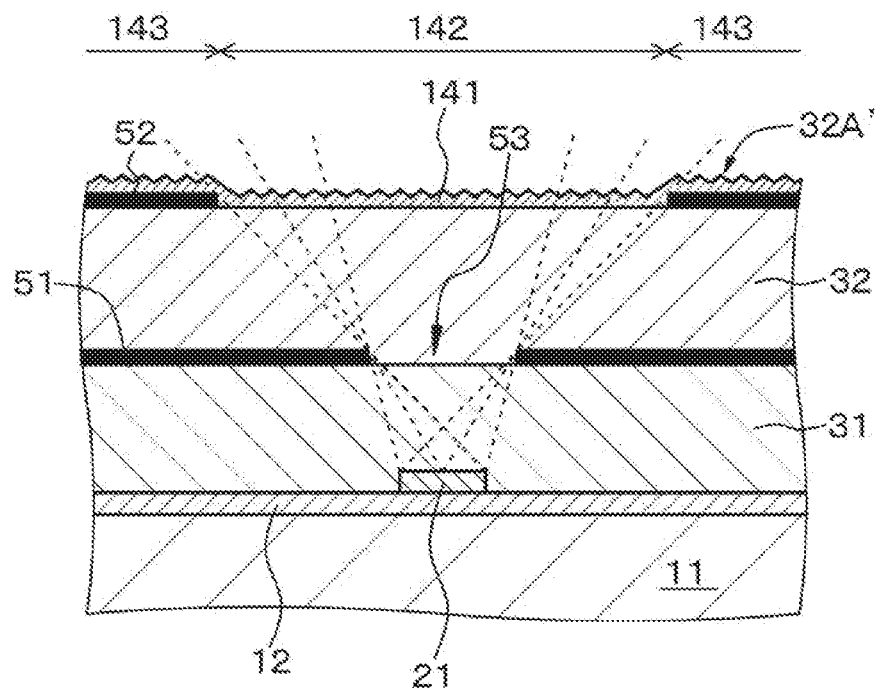
FIGS. 4A and 4B are schematic partial cross-sectional diagrams of a modification example (light emitting device of Example 1 D) of the light emitting device of Example 1C.
Figure 4B:
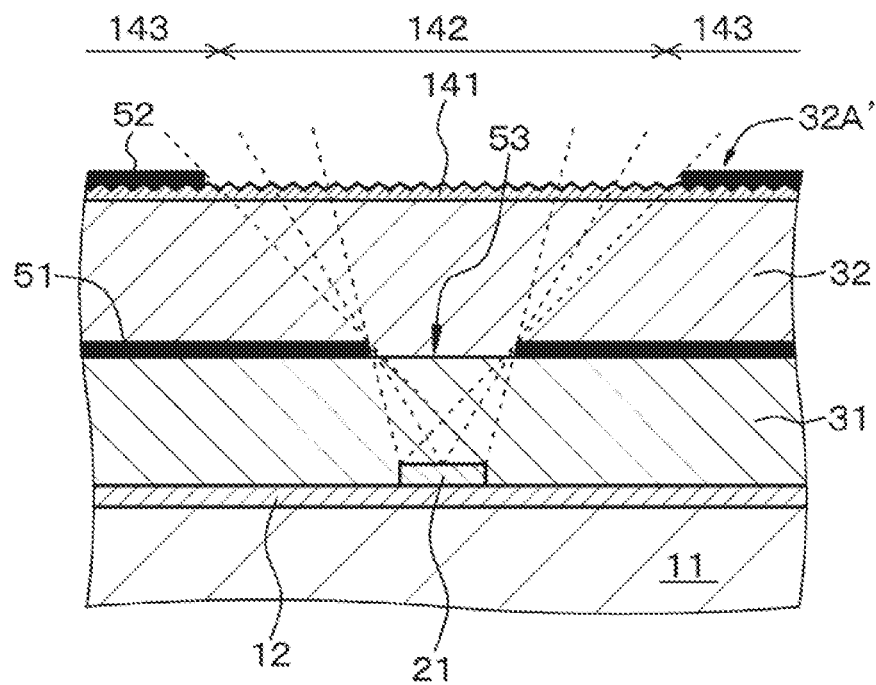

Schematic partial cross-sectional diagrams of Example 1D that is a modification example of Example 1C are illustrated in FIGS. 4A and 4B. In a light emitting device of Example 1D, the second black layer 52 is formed in regions 32A' of the second interlayer film 32 that is occupied by the light diffusion region extension part 143. In the illustrated example, the light diffusion region extension part 143 and the second black layer 52 overlap with each other. Further, the light diffusion region extension part 143 are located on the upper side of the second black layer 52 (see FIG. 4A). Alternatively, the light diffusion region extension part 143 is located on the lower side of the second black layer 52 (see FIG. 4B).

Example 1E

Figure 5A:
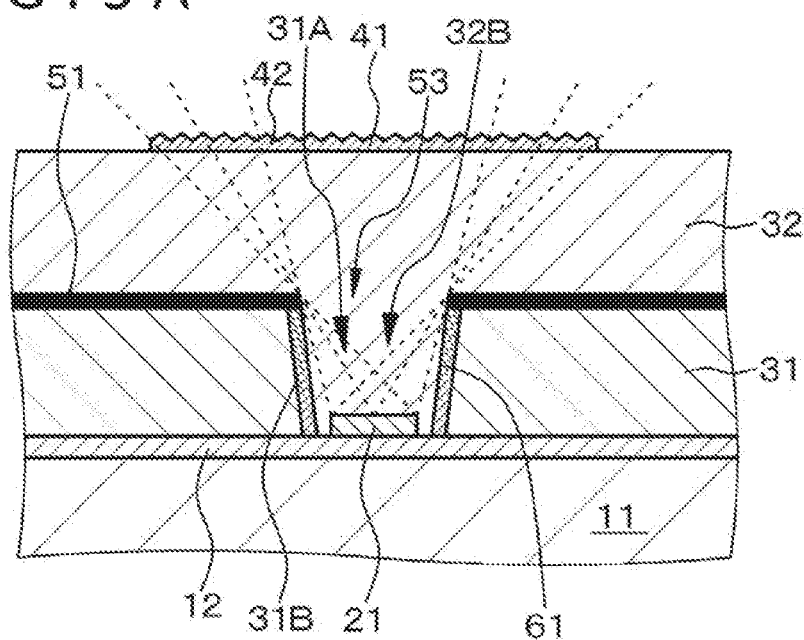
FIGS. 5A and 5B are schematic partial cross-sectional diagrams of a light emitting device of Example 1E that is a modification example of the light emitting device of Example 1 and a modification example of the light emitting device of Example 1 D.
Figure 5B:
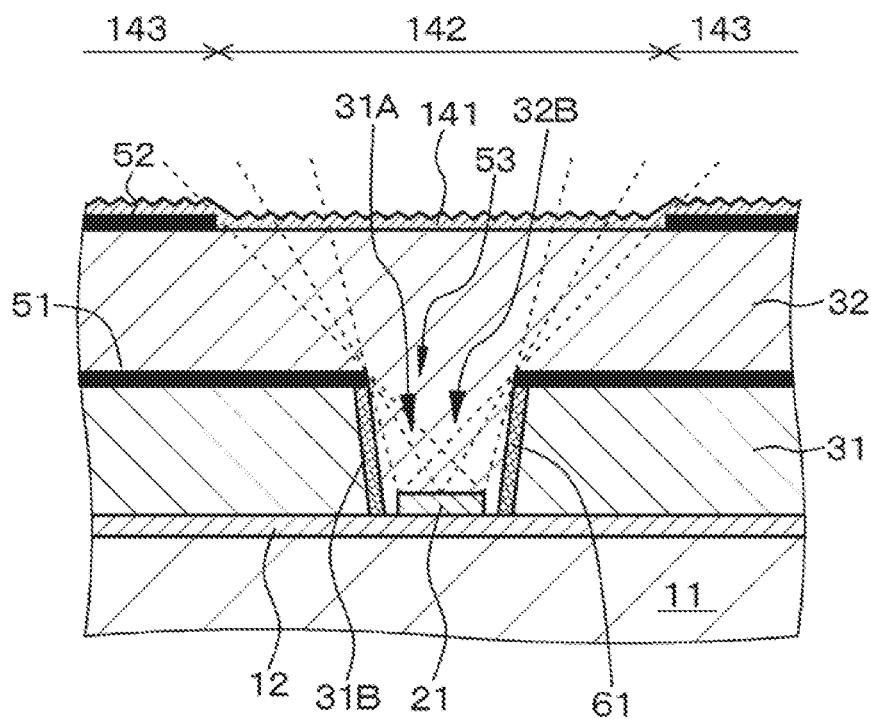

Schematic partial cross-sectional diagrams of a light emitting device of Example 1E that is a modification example of the light emitting device of Example 1 and is a modification example of the light emitting device of Example 1D are illustrated in FIGS. 5A and 5B. In the light emitting device of Example 1E, the light reflection film 61 that reflects a portion of light emitted from the light emitting part 21 and allows the light to pass through the opening part 53 is formed on the first interlayer film 31. Specifically, the region 31A of the first interlayer film 31 that is located above the light emitting part 21 is replaced with the second interlayer film 32. Further, between a part 32B of the second interlayer film 32 that is located above the light emitting part 21 and the first interlayer film 31, the light reflection film 61 is formed. A cross-sectional shape of an inclined plane 31B of the first interlayer film 31 on which the light reflection film 61 is formed is composed of line segments. In the illustrated example, the light reflection film 61 is formed in the entire region in the thickness direction of the first interlayer film 31. Note, however, that it is not limited thereto, and the light reflection film 61 may be formed in a portion of region in the thickness direction of the first interlayer film 31. It goes without saying that the light reflection film 61 is applicable to other modification examples of Example 1.

In Example 1E, light emitted from the light emitting part 21 is reflected by the light reflection film 61, and therefore the light does not penetrate into the first interlayer film 31. Therefore, a problem that the first interlayer film or the like is deteriorated due to light emitted from the light emitting part 21 can be prevented from being caused. As the first interlayer film 31, for example, materials (resin) that is scarce in resistance to light emitted from the light emitting part 21 can be used, or alternatively, inexpensive materials (resin) can be used.

Example 2

Figure 6A:
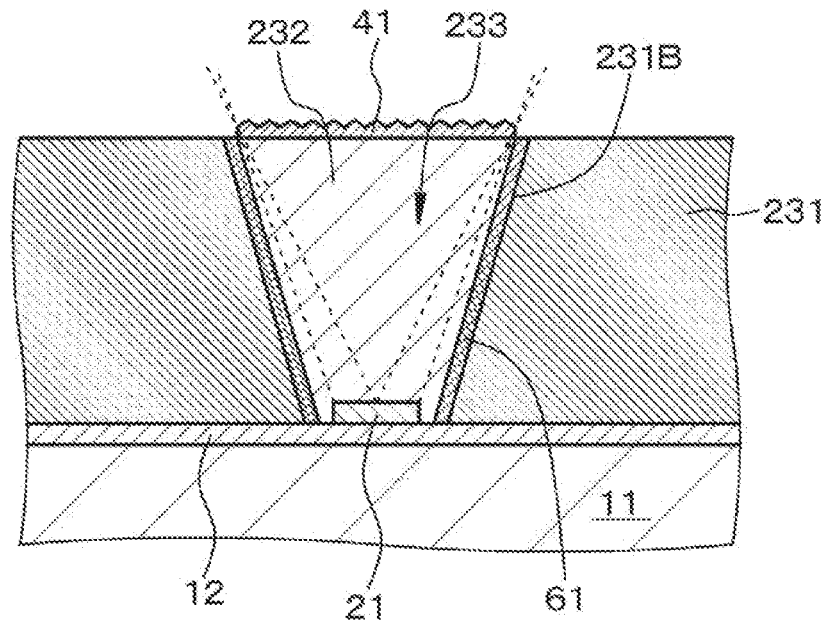
FIGS. 6A and 6B are schematic partial cross-sectional diagrams of a light emitting device of Example 2.
Figure 6B:
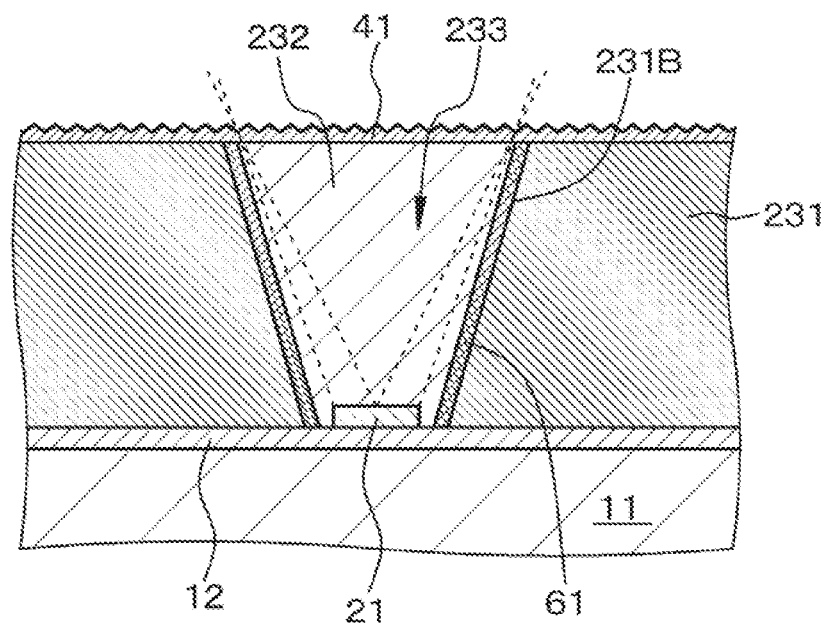

Example 2 relates to the light emitting device according to the second aspect of the present disclosure. Schematic partial cross-sectional diagrams of a light emitting device of Example 2 are illustrated in FIGS. 6A and 6B.

The light emitting device of Example 2 includes the light emitting part 21, a black first interlayer film 231, a transparent second interlayer film 232 that is surrounded by the first interlayer film 231 and covers the light emitting part 21, and the light diffusion part 41 that is formed on the second interlayer film 232.

In addition, light emitted from the light emitting part 21 passes through the light diffusion part 41 via the second interlayer film 232. Between the first interlayer film 231 and the second interlayer film 232, the light reflection film 61 that reflects a portion of light emitted from the light emitting part 21 and allows the light to pass through the light diffusion part 41 is formed.

The black first interlayer film 231 includes materials in which carbon is added to epoxy resin, silicone resin, or hybrid resin. Further, the transparent second interlayer film 232 includes epoxy resin, silicone resin, or hybrid resin. The light emitting part 21 is attached to the base substance 11. Specifically, the light emitting part 21 is attached to the wiring layer 12 that is formed on the base substance 11 including a glass substrate or a printed-wiring board.

In the light emitting device of Example 2, after the light emitting unit is implemented in the wiring layer 12, the first interlayer film 231 is formed on the basis of the printing method. Subsequently, the opening part 233 is formed in a portion of the first interlayer film 231 that is located above the light emitting part 21 and the light reflection film 61 is formed in an inclined plane 231B of the first interlayer film 231 that faces the opening part 233. Then, the opening part 233 is embedded with the second interlayer film 232 on the basis of the printing method and further the light diffusion part 41 is formed on the basis of the printing method to thereby manufacture the light emitting device of Example 2. Note that the light diffusion part 41 just has to be formed under conditions that an uneven portion is formed on the top face of the light diffusion part 41 at the time of forming the light diffusion part 41 on the basis of the printing method. As illustrated in FIG. 6A, the light diffusion part 41 may be formed on the second interlayer film 232. Alternatively, as illustrated in FIG. 6B, the light diffusion part 41 may be formed on the second interlayer film 232 and the first interlayer film 231.

As described above, even in the light emitting device of Example 2, light emitted from the light emitting part passes through the light diffusion part. Therefore, even if the light orientation characteristics (radiation distribution) of light emitted from the light emitting part are in an undesired state, the orientation characteristics (radiation distribution) of the light passing through the light diffusion part can be set to a desired state. That is, an improvement in the orientation characteristics (radiation distribution) of the light emitted from the light emitting device can be achieved. Further, since the light emitting device includes the black first interlayer film, the prevention of an occurrence of black floating can be attained. Further, a miniaturization of the light emitting device and even a miniaturization of an arrangement pitch of the light emitting device can be easily handled.

Example 2A

Figure 7A:
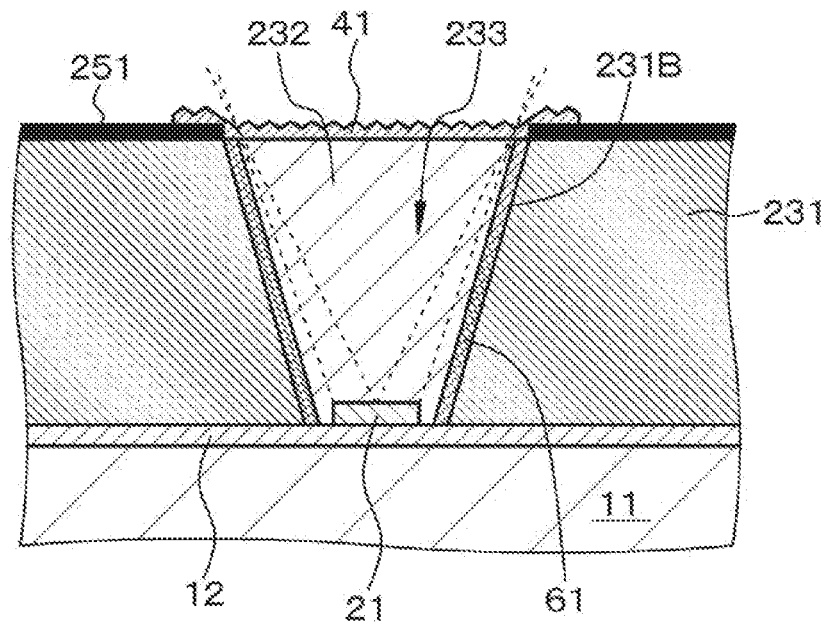
FIGS. 7A and 7B are schematic partial cross-sectional diagrams of Example 2A that is a modification example of Example 2.
Figure 7B:
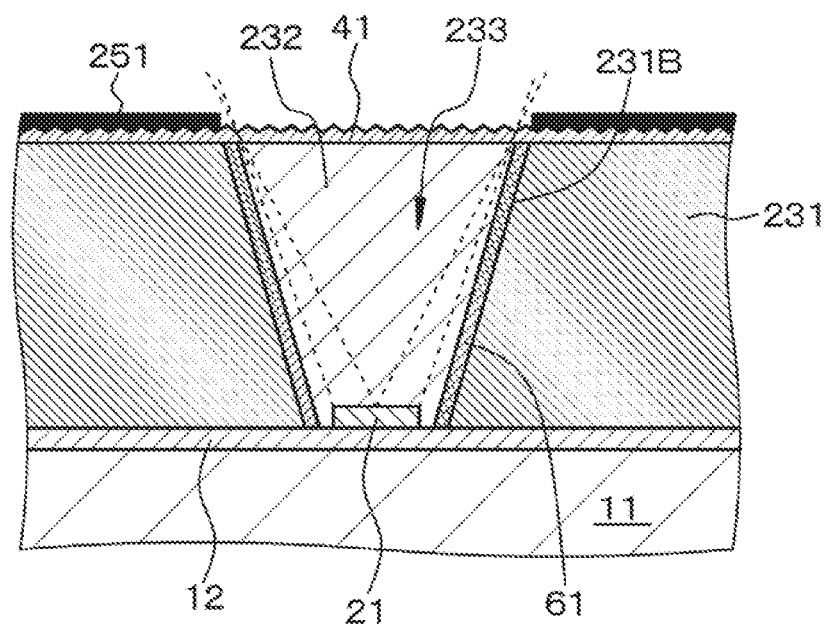

In the light emitting device of Example 2, a black layer 251 may be formed on the first interlayer film 231. Schematic partial cross-sectional diagrams of Example 2A that is a modification example of Example 2 are illustrated in FIGS. 7A and 7B. In an example illustrated in FIG. 7A, the edge portion of the light diffusion part 41 and the edge portion of the black layer 251 overlap with each other. Further, the edge portion of the light diffusion part 41 is located on the upper side of the edge portion of the black layer 251. Note that the edge portion of the light diffusion part 41 may be located on the lower side of the edge portion of the black layer 251. In an example illustrated in FIG. 7B, the light diffusion part 41 and the black layer 251 overlap with each other. Further, the light diffusion part 41 is located on the lower side of the black layer 251. Note that FIG. 7A illustrates a modification of the light emitting device of Example 2 illustrated in FIG. 6A and FIG. 7B illustrates a modification of the light emitting device of Example 2 illustrated in FIG. 6B. The light diffusion part 41 may be located on the upper side of the black layer 251. The black layer 251 or the later-described black layer 252 can be set to the configuration similarly to that of the black layer 51 described in Example 1.

Example 2B

Figure 8A:
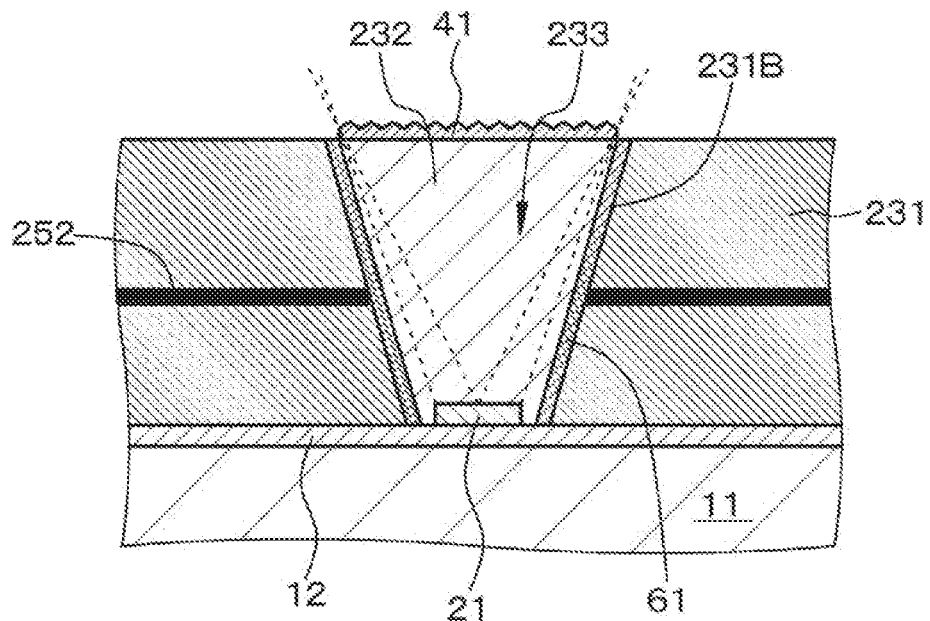
FIGS. 8A and 8B are schematic partial cross-sectional diagrams of Example 2B that is a modification example of Example 2.
Figure 8B:
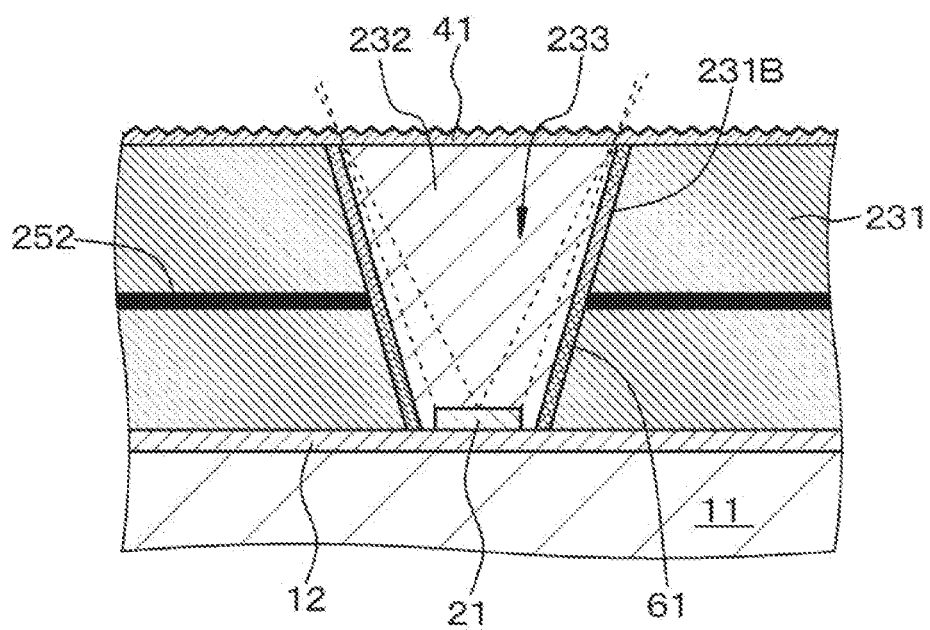
Figure 9A:
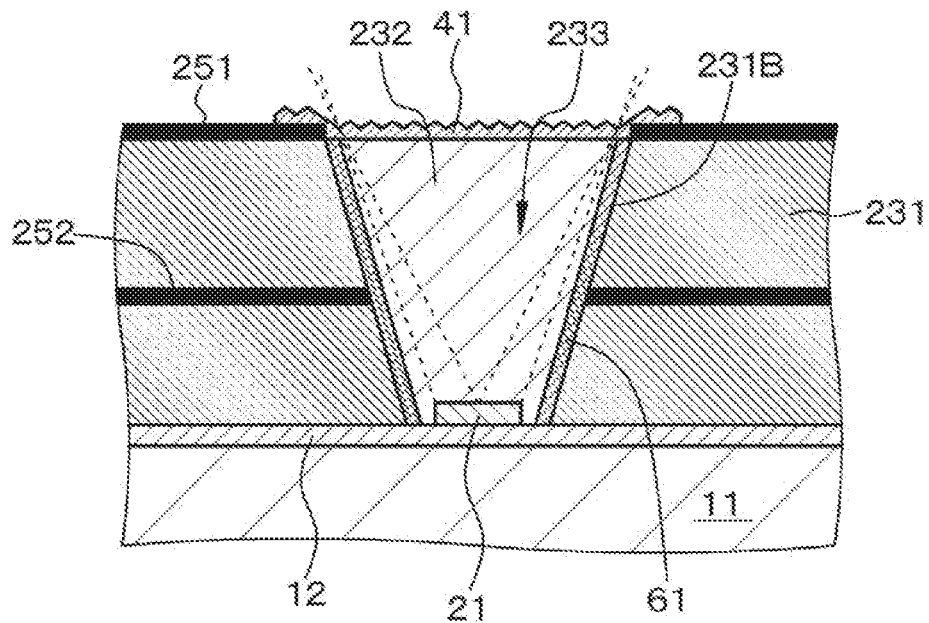
FIGS. 9A and 9B are schematic partial cross-sectional diagrams of a light emitting device in which Example 2A and Example 2B are combined.
Figure 9B:
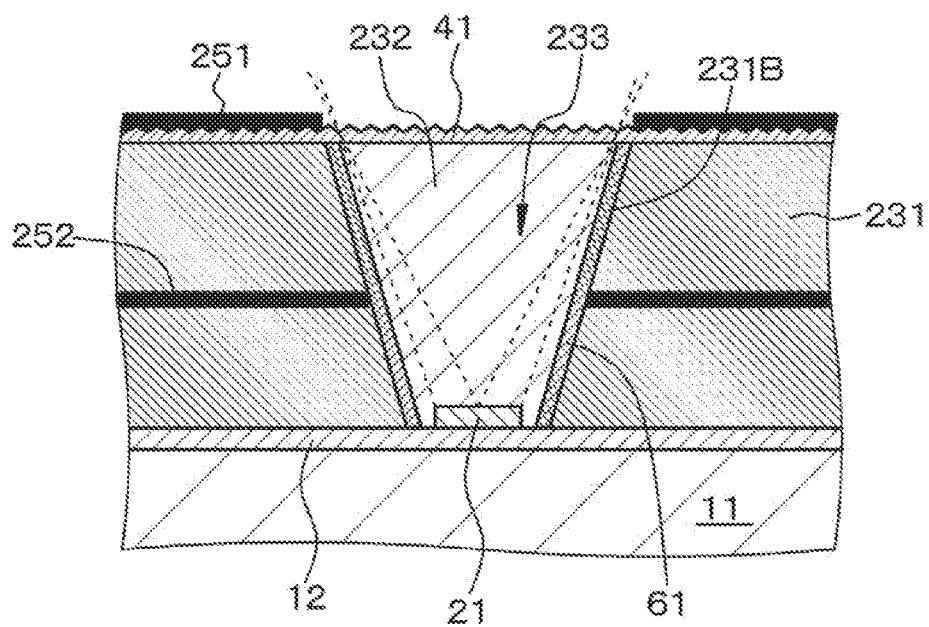

Alternatively, in the light emitting device of Example 2, the black layer 252 may be formed within the first interlayer film 231. Schematic partial cross-sectional diagrams of Example 2B that is a modification example of Example 2 are illustrated in FIGS. 8A and 8B. Note that FIG. 8A illustrates a modification of the light emitting device of Example 2 illustrated in FIG. 6A and FIG. 8B illustrates a modification of the light emitting device of Example 2 illustrated in FIG. 6B. Further, the black layer 251 of Example 2A and the black layer 252 of Example 2B may be combined (see FIGS. 9A and 9B).

Reference Example 1

Figure 10A:
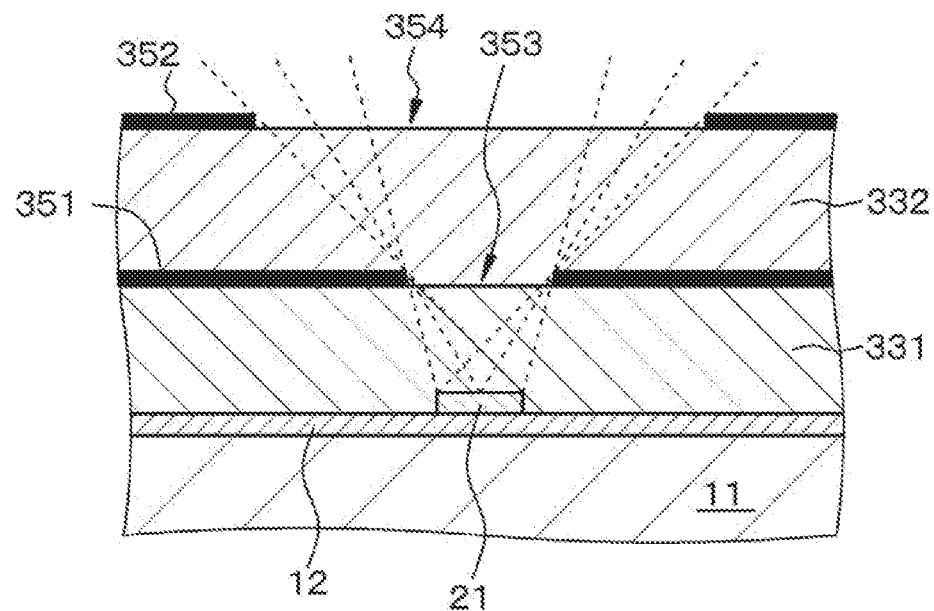
FIGS. 10A and 10B are schematic partial cross-sectional diagrams of a light emitting device of Reference Example 1 and Reference Example 1A that is a modification example of Reference Example 1.
Figure 10B:
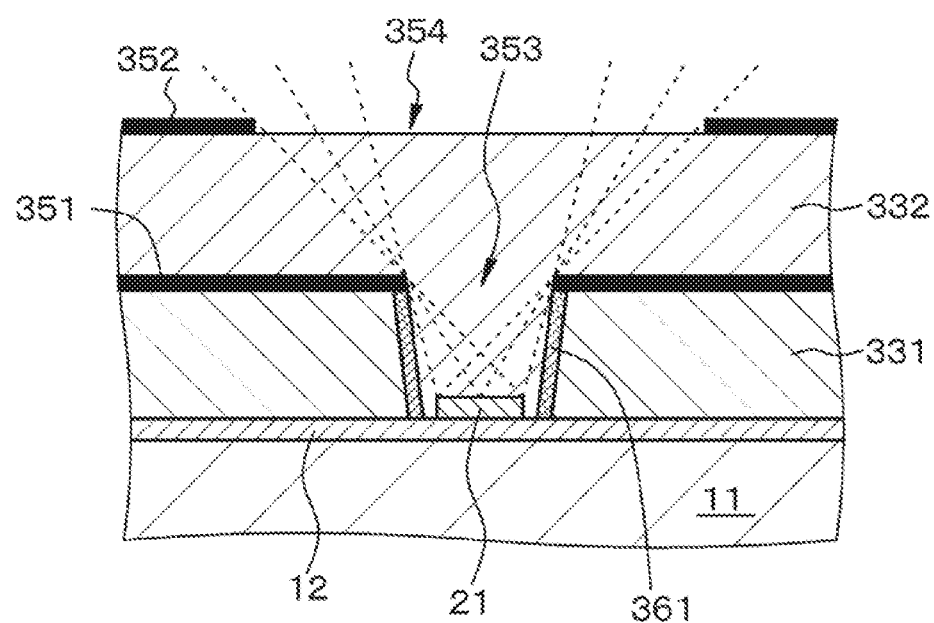

A schematic partial cross-sectional diagram of the light emitting device of Reference Example 1 is illustrated in FIG. 10A. The light emitting device of Reference Example 1 includes the light emitting part 21, a first interlayer film 331 that covers the light emitting part 21, a first black layer 351 that is formed on the first interlayer film 331 and is provided with a first opening part 353 that allows light emitted from the light emitting part 21 to pass through it, a second interlayer film 332 that covers the first black layer 351, and a second black layer 352 that is formed on the second interlayer film 332 and is provided with the second opening part 354 that allows light emitted from the light emitting part 21 to pass through it. In addition, like a schematic partial cross-sectional diagram illustrated in FIG. 10B, a light reflection film 361 that reflects a portion of light emitted from the light emitting part 21 and allows the light to pass through the first opening part 353 may be formed on the first interlayer film 331.

In Reference Example 1, since the light emitting device includes the first black layer and the second black layer, the prevention of an occurrence of black floating can be surely attained. Note that materials constituting the first interlayer film 331, the second interlayer film 332, the first black layer 351, the second black layer 352, and the light reflection film 361 just have to be the same as those described in Example 1.

Reference Example 2

Figure 11A:
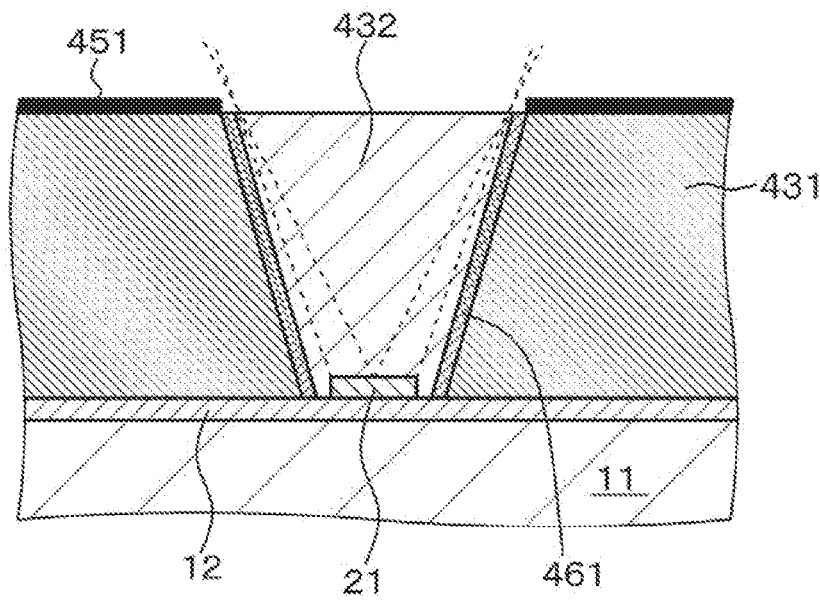
FIGS. 11A and 11B are schematic partial cross-sectional diagrams of a light emitting device of Reference Example 2 and Reference Example 2A that is a modification example of Reference Example 2.
Figure 11B:
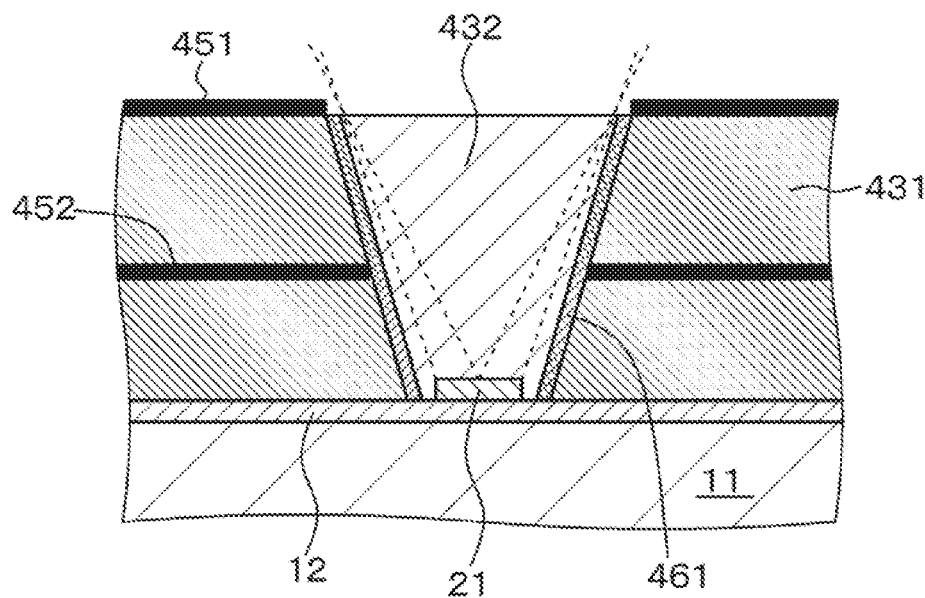

A schematic partial cross-sectional diagram of the light emitting device of Reference Example 2 is illustrated in FIG. 11A. The light emitting device of Reference Example 2 includes the light emitting part 21, a black first interlayer film 431, and a transparent second interlayer film 432 that is surrounded by the first interlayer film 431 and covers the light emitting part 21. Light from the light emitting part 21 is emitted via the second interlayer film 432, a black layer 451 is formed on the first interlayer film 431, and a light reflection film 461 that reflects a portion of light emitted from the light emitting part 21 and emits the light to the outside is formed between the first interlayer film 431 and the second interlayer film 432. Further, like the schematic partial cross-sectional diagram illustrated in FIG. 11B, a second black layer 452 may be formed within the first interlayer film 431.

Even in Reference Example 2, since the light emitting device includes the black layer, the prevention of an occurrence of black floating can be surely attained. Note that materials constituting the first interlayer film 431, the second interlayer film 432, the black layer 451, the second black layer 452, and the light reflection film 461 just have to be the same as those described in Example 2 or Example 1.

As described above, the light emitting device and the display apparatus of the present disclosure are described on the basis of preferable examples. However, the light emitting device and the display apparatus of the present disclosure are not limited to these examples. A configuration, structure, and configuration material of the light emitting device, and a method for manufacturing the light emitting device described in the examples are illustrative and can be appropriately changed. In the black layer of Example 1, for example, not only one layer but also a plurality of layers may be provided.

Figure 12A:
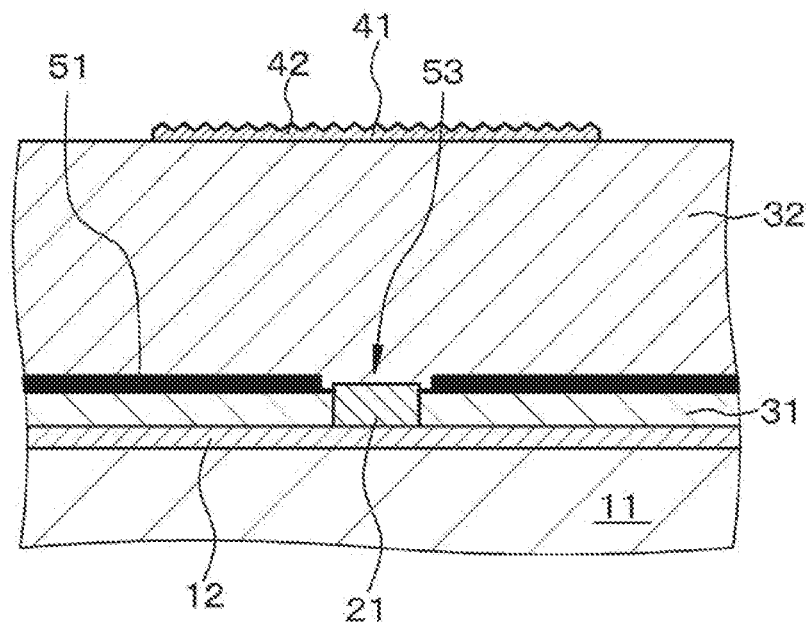
FIGS. 12A and 12B are schematic partial cross-sectional diagrams of a modification example of the light emitting device of Example 1.
Figure 12B:
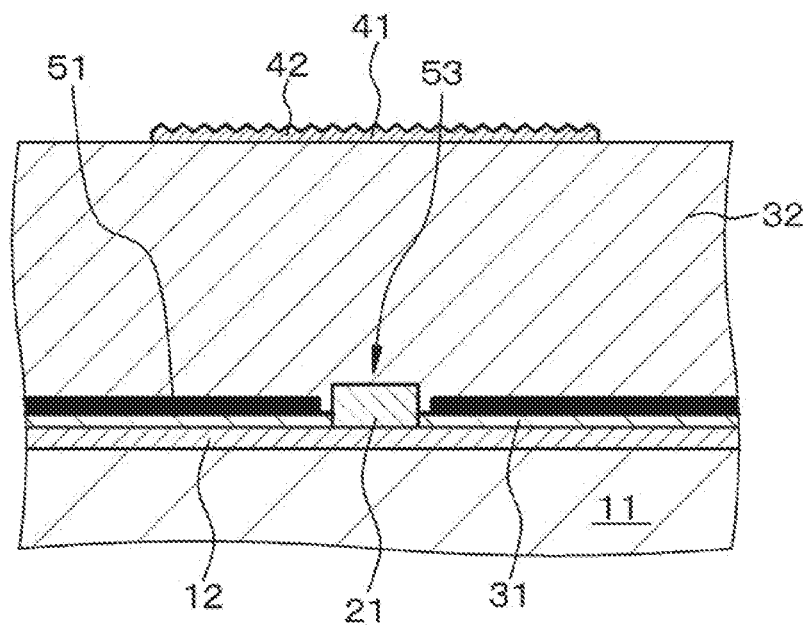

In Example 1, a mode in which the black layer 51 is formed above the light emitting part 21 is exclusively described. Further, as illustrated in FIGS. 12A and 12B, the black layer 51 may be formed in the same level (or approximately the same level) as that of the top face of the light emitting part 21. Alternatively, the black layer 51 may be formed in a level under the top face of the light emitting part 21 and above the base substance. In these examples, the light emitting device includes the first interlayer film 31 on which the black layer 51 is formed and the second interlayer film 32 that covers the black layer 51 and the light emitting part 21 and on which the light diffusion part 41 is formed. The second interlayer film 32 that covers the black layer 51 is formed even within the opening part 53 that is formed in the black layer 51. Further, the light emitting part 21 is located within the opening part 53. An orthogonally projected image of the light emitting part 21 on the base substance 11 and an orthogonally projected image of the black layer 51 on the base substance 11 do not overlap with each other. Specifically, a gap is present between the orthogonally projected image of the light emitting part 21 on the base substance 11 and the orthogonally projected image of the black layer 51 on the base substance 11.

Figure 13:
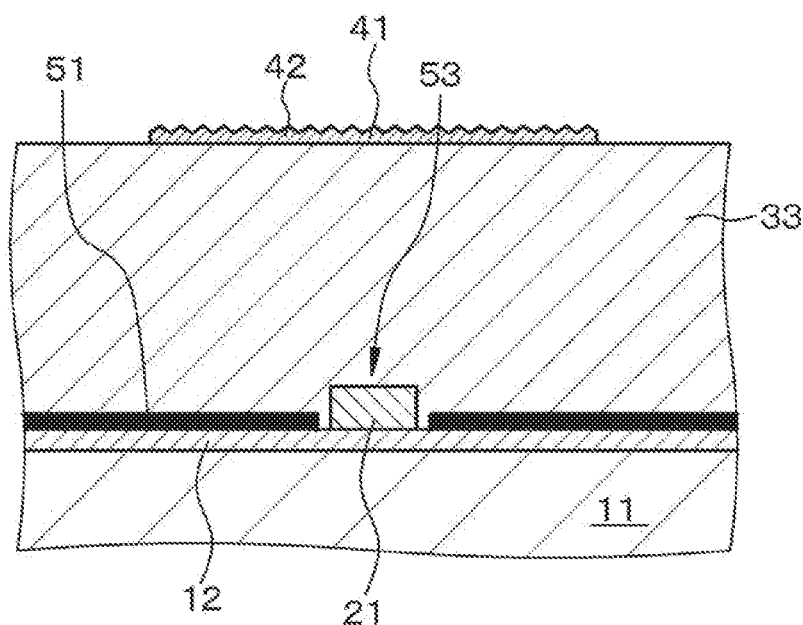
FIG. 13 is a schematic partial cross-sectional diagram of a modification example of the light emitting device of Example 1.

Alternatively, as illustrated in FIG. 13, the black layer 51 may be formed on the base substance 12. In this example, the light emitting device includes an interlayer film 33 that covers the black layer 51 and the light emitting part 21 and on which the light diffusion part 41 is formed. The interlayer film 33 that covers the black layer 51 is formed even within the opening part 53 that is formed in the black layer 51. Further, the light emitting part 21 is located within the opening part 53. The orthogonally projected image of the light emitting part 21 on the base substance 11 and the orthogonally projected image of the black layer 51 on the base substance 11 do not overlap with each other. Specifically, a gap is present between the orthogonally projected image of the light emitting part 21 on the base substance 11 and the orthogonally projected image of the black layer 51 on the base substance 11.

Note that modification examples of the light emitting device of Example 1 illustrated in FIGS. 12A, 12B, and 13 are applicable to those of the light emitting device of Example 1 described in Examples 1A to 1E.

As the light emitting device constituting the light emitting unit, a fourth light emitting device, a fifth light emitting device, . . . may be further added to a first light emitting device, a second light emitting device, and a third light emitting device. As the above example, for example, the light emitting unit to which a sub-pixel that emits white light is added in order to improve luminance, the light emitting unit to which a sub-pixel that emits a complimentary color is added in order to enlarge a color reproduction range, the light emitting unit to which a sub-pixel that emits yellow light is added in order to enlarge a color reproduction range, and the light emitting unit to which a sub-pixel that emits light of yellow and cyan is added in order to enlarge a color reproduction range may be exemplified.

The display apparatus (light emitting device display apparatus) can be used not only as a flat/direct viewing type image display apparatus of a color display typified by a television receiver or computer terminal but also as an image display apparatus that projects an image on retinas of a person or a projection type image display apparatus. Note that in the image display apparatuses, but not limited thereto, for example, a drive method of a field sequential mode just has to be adopted in which respective luminescent/non-luminescent states of the first light emitting device, the second light emitting device, and the third light emitting device are performed under time-division control to thereby display an image.

In addition, the present disclosure may have the following configurations

[A01]

<<Light Emitting Device: First Aspect>>

A light emitting device including:
  a light emitting part;
  a black layer; and
  a light diffusion part that is formed on or above the black layer, in which
  the black layer is provided with an opening part that allows light emitted from the light emitting part to pass through it, and
  light having passed through the opening part passes through the light diffusion part.

[A02]

The light emitting device according to [A01], in which the black layer is formed above the light emitting part, the light emitting device includes:
  a first interlayer film that covers the light emitting part and on which the black layer is formed; and
  a second interlayer film that covers the black layer and on which the light diffusion part is formed.

[A03]

The light emitting device according to [A01], further including:
  a first interlayer film on which the black layer is formed; and
  a second interlayer film that covers the black layer and the light emitting part and on which the light diffusion part is formed, in which
  the light emitting part is located within the opening part.

[A04]

The light emitting device according to [A01], further including:

an interlayer film that covers the black layer and the light emitting part and on which the light diffusion part is formed, in which the light emitting part is located within the opening part.

[A05]

The light emitting device according to any one of [A02] to [A04], in which the light diffusion part includes a light diffusion region through which the light having passed through the opening part passes.

[A06]

The optical device according to [A05], in which a second black layer is formed in a region of the second interlayer film that is not occupied by the light diffusion region.

[A07]

The light emitting device according to any one of [A02] to [A04], in which the light diffusion part includes the light diffusion region through which the light having passed through the opening part passes and a light diffusion region extension part that extends from the light diffusion region.

[A08]

The optical device according to [A07], in which the second black layer is formed in a region of the second interlayer film that is occupied by the light diffusion region extension part.

[A09]

The light emitting device according to any one of [A02] to [A08], in which a light reflection film that reflects a portion of the light emitted from the light emitting part and allows the light to pass through the opening part is formed on the first interlayer film.

[A10]

The light emitting device according to any one of [A01] to [A09], in which the light emitting part is attached to a base substance, and an orthogonally projected image of the light emitting part on the base substance and an orthogonally projected image of the black layer on the base substance do not overlap with each other.

[B01]

<<Light Emitting Device: Second Aspect>>

A light emitting device including:

a light emitting part;

a black first interlayer film;

a transparent second interlayer film that is surrounded by the first interlayer film and covers the light emitting part; and a light diffusion part that is formed on the second interlayer film, in which light emitted from the light emitting part passes through the light diffusion part via the second interlayer film, and a light reflection film that reflects a portion of the light emitted from the light emitting part and allows the light to pass through the light diffusion part is formed between the first interlayer film and the second interlayer film.

[B02]

The light emitting device according to [B01], in which a black layer is formed on the first interlayer film.

[B03]

The light emitting device according to [B01], in which the black layer is formed within the first interlayer film.

[C01]

<<Display Apparatus>>

A display apparatus including:

arraying the light emitting device according to any one of [A01] to [B03] in plurality in a two-dimensional matrix form.

[D01]

<<Light Emitting Device>>

A light emitting device including:

a light emitting part;

a first interlayer film that covers the light emitting part;

a first black layer that is formed on the first interlayer film and is provided with a first opening part that allows light emitted from the light emitting part to pass through it;

a second interlayer film that covers the first black layer; and a second black layer that is formed on the second interlayer film and is provided with the second opening part that allows the light emitted from the light emitting part to pass through it.

[D02]

The light emitting device according to [D01], in which a light reflection film that reflects a portion of the light emitted from the light emitting part and allows the light to pass through the first opening part is formed on the first interlayer film.

[E01]

<<Light Emitting Device>>

A light emitting device including:

a light emitting part;

a black first interlayer film; and a transparent second interlayer film that is surrounded by the first interlayer film and covers the light emitting part, in which light from the light emitting part is emitted via the second interlayer film, the black layer is formed on the first interlayer film, and a light reflection film that reflects a portion of light emitted from the light emitting part and emits the light to the outside is formed between the first interlayer film and the second interlayer film.

[E02]

The light emitting device according to [E01], in which the second black layer is formed within the first interlayer film.

[C02]

<<Display Apparatus>>

A display apparatus including:

arraying the light emitting device according to any one of [C01] to [E02] in plurality in a two-dimensional matrix form.

REFERENCE SIGNS LIST

11 . . . Base substance, 12 . . . Wiring layer, 21 . . . Light emitting part, 31, 231 . . . First interlayer film, 31A . . . Portion of first interlayer film that is located under bottom of opening part, 31B, 231B . . . Inclined plane of first interlayer film, 32, 232 . . . Second interlayer film, 32A . . . Region of second interlayer film that is not occupied by light diffusion region, 32A' . . . Region of second interlayer film that is occupied by light diffusion region extension part, 32B . . . Portion of second interlayer film that is located above light emitting part, 33 . . . Interlayer film, 41, 141 . . . Light diffusion part, 42, 142 . . . Light diffusion region, 143 . . . Light diffusion region extension part, 51, 251, 252 . . . Black layer, 52 . . . Second black layer, 53 . . . Opening part, 61 . . . Light reflection film, 233 . . . Opening part that is provided in portion of first interlayer film, NL . . . Normal line passing through center of light emitting part

The invention claimed is:

1. A light emitting device, comprising:
a light emitting part configured to emit light;
a first black layer;
a first interlayer film on the first black layer, wherein the first interlayer film covers an entire surface of the first black layer;
a second black layer in a specific region of the first interlayer film; and
a light diffusion part above the first black layer, wherein
an edge portion of the light diffusion part is in contact with an edge portion of the second black layer,
the first black layer has an opening part,
the first black layer is configured to allow the light emitted from the light emitting part to pass through the opening part, and
the light that passes through the opening part further passes through the light diffusion part.

2. The light emitting device according to claim 1, wherein the first black layer is above the light emitting part,
the light emitting device further includes a second interlayer film that covers the light emitting part,
the first black layer is on the second interlayer film, and
the light diffusion part is on the first interlayer film.

3. The light emitting device according to claim 2, wherein the light diffusion part includes a light diffusion region, and
the light that passes through the opening part further passes through the light diffusion region.

4. The light emitting device according to claim 3, wherein the specific region of the first interlayer film is unoccupied by the light diffusion region.

5. The light emitting device according to claim 2, wherein the light diffusion part includes a light diffusion region and a light diffusion region extension part,
the light that passes through the opening part further passes through the light diffusion region, and
the light diffusion region extension part extends from the light diffusion region.

6. The light emitting device according to claim 5, wherein the specific region of the first interlayer film is occupied by the light diffusion region extension part.

7. The light emitting device according to claim 2, further comprising a light reflection film on the second interlayer film, wherein the light reflection film is configured to:
reflect a portion of the light emitted from the light emitting part; and
allow the light emitted from the light emitting part to pass through the opening part.

8. The light emitting device according to claim 1, further comprising a second interlayer film, wherein
the first black layer is on the second interlayer film,
the first interlayer film covers the light emitting part, and
the light emitting part is located within the opening part.

9. The light emitting device according to claim 1, wherein the first interlayer film covers the light emitting part,
the light diffusion part is on the first interlayer film, and
the light emitting part is located within the opening part.

10. The light emitting device according to claim 1, wherein
the light emitting part is attached to a base substance, and
an orthogonally projected image of the light emitting part on the base substance nonoverlaps with an orthogonally projected image of the first black layer on the base substance.

11. A light emitting device, comprising:
a light emitting part configured to emit light;
a black interlayer film;
a first black layer within the black interlayer film;
a transparent interlayer film surrounded by the black interlayer film and covers the light emitting part;
a second black layer on the black interlayer film;
a light diffusion part on the transparent interlayer film, wherein
an edge portion of the light diffusion part is in contact with an edge portion of the second black layer, and
the light emitted from the light emitting part passes through the light diffusion part via the transparent interlayer film; and
a light reflection film between the black interlayer film and the transparent interlayer film, wherein the light reflection film is configured to:
reflect a portion of the light emitted from the light emitting part; and
allow the light emitted from the light emitting part to pass through the light diffusion part.

12. A display apparatus, comprising:
a plurality of light emitting devices arrayed in a two-dimensional matrix, wherein each light emitting device of the plurality of light emitting devices includes:
a light emitting part configured to emit light;
a first black layer that has an opening part;
an interlayer film on the first black layer, wherein the interlayer film covers an entire surface of the first black layer;
a second black layer in a specific region of the interlayer film; and
a light diffusion part above the first black layer, wherein
an edge portion of the light diffusion part is in contact with an edge portion of the second black layer,
the first black layer is configured to allow the light emitted from the light emitting part to pass through the opening part, and
the light that passes through the opening part further passes through the light diffusion part.

13. A light emitting device, comprising:
a light emitting part configured to emit light;
a first black layer above the light emitting part;
a first interlayer film on the first black layer;
a second interlayer film that covers the light emitting part;
a second black layer in a specific region of the first interlayer film; and
a light diffusion part above the first black layer, wherein
an edge portion of the light diffusion part is in contact with an edge portion of the second black layer,
the light diffusion part includes a light diffusion region,
the specific region of the first interlayer film is unoccupied by the light diffusion region,
the first black layer has an opening part,
the first black layer is configured to allow the light emitted from the light emitting part to pass through the opening part, and
the light that passes through the opening part further passes through the light diffusion region of the light diffusion part.

* * * * *